(12) United States Patent   (10) Patent No.: US 7,531,465 B2
Cho et al.                 (45) Date of Patent: May 12, 2009

(54) METHOD OF MANUFACTURING NITRIDE-BASED SEMICONDUCTOR LIGHT EMITTING DEVICE

(75) Inventors: Jae-hee Cho, Yongin-si (KR); Cheol-soo Sone, Yongin-si (KR); Dong-yu Kim, Gwangju-si (KR); Hyun-gi Hong, Gwangju-si (KR); Seok-soon Kim, Gwangju-si (KR)

(73) Assignee: Samsung Electro-Mechanics Co., Ltd. (KR)

( * ) Notice: Subject to any disclaimer, the term of this patent is extended or adjusted under 35 U.S.C. 154(b) by 236 days.

(21) Appl. No.: 11/690,504

(22) Filed: Mar. 23, 2007

(65) Prior Publication Data

US 2007/0269918 A1    Nov. 22, 2007

(30) Foreign Application Priority Data

May 19, 2006  (KR) .................. 10-2006-0045112

(51) Int. Cl.
    *H01L 21/31* (2006.01)
(52) U.S. Cl. .................... 438/781; 438/35; 438/42; 438/759; 430/519; 257/E21.026; 257/E21.028
(58) Field of Classification Search ............. 438/35, 438/39, 42, 47, 759, 781; 430/519; 257/E21.026, 257/E21.028
    See application file for complete search history.

(56) References Cited

U.S. PATENT DOCUMENTS 7,053,420 B2 *  5/2006  Tadatomo et al. ............. 257/98

* cited by examiner

*Primary Examiner*—George Fourson
*Assistant Examiner*—Julio J Maldonado
(74) *Attorney, Agent, or Firm*—Cantor Colburn LLP

(57) ABSTRACT

Provided is a method of manufacturing a nitride-based semiconductor light-emitting device having an improved structure in which optical extraction efficiency is improved. The method of manufacturing a nitride-based semiconductor light-emitting device including an n-doped semiconductor layer, an active layer, a p-doped semiconductor layer, an n-electrode and a p-electrode includes: forming an azobenzene-functionalized polymer film on a base layer by selecting one layer from the group consisting of the n-doped semiconductor layer, the p-doped semiconductor layer, the n-electrode and the p-electrode as the base layer; forming surface relief gratings of a micro-pattern caused by a photophysical mass transport property of azobenzene-functionalized polymer by irradiating interference laser beams onto the azobenzene-functionalized polymer film; forming a photonic crystal layer using a metal oxide on a recessed gap of the azobenzene-functionalized polymer film, and removing the azobenzene-functionalized polymer film.

17 Claims, 11 Drawing Sheets

FIG. 4D
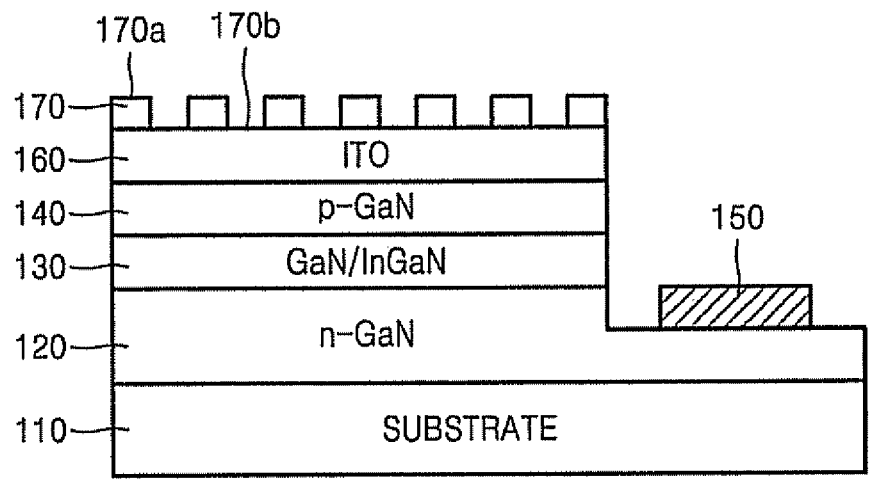
FIG. 4D-a
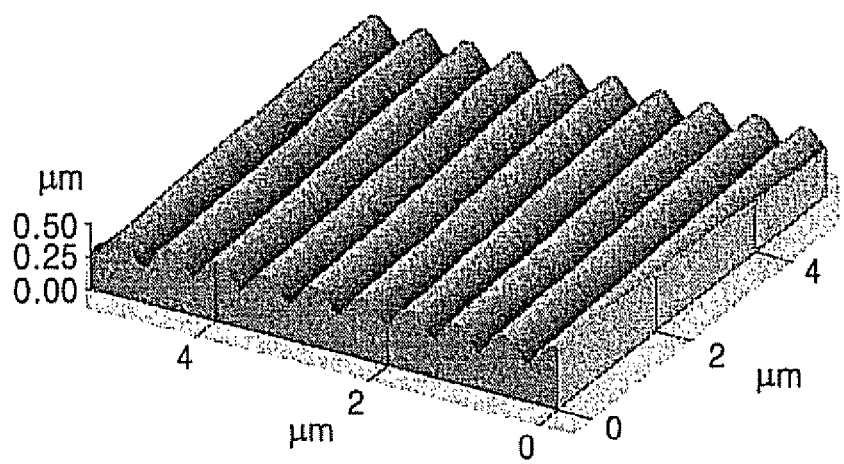
FIG. 4D-b
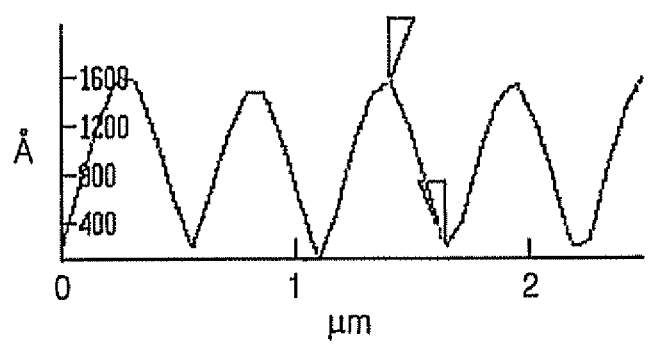

FIG. 4G
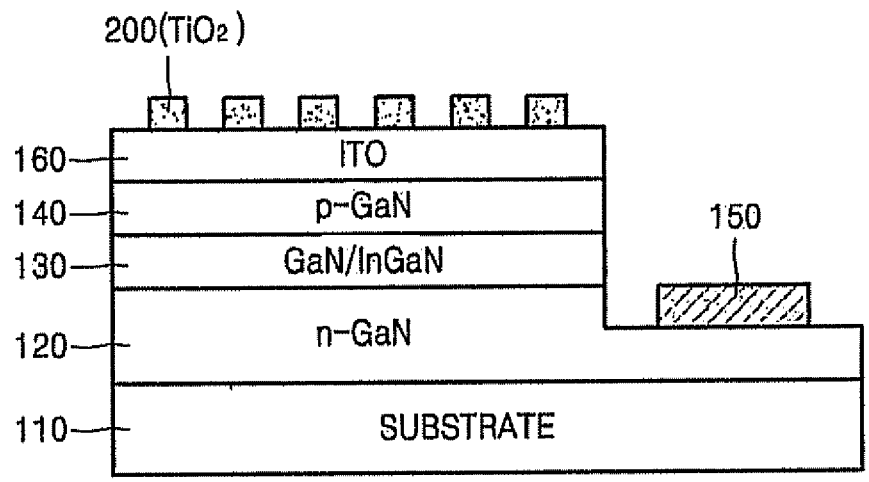
FIG. 4G-a
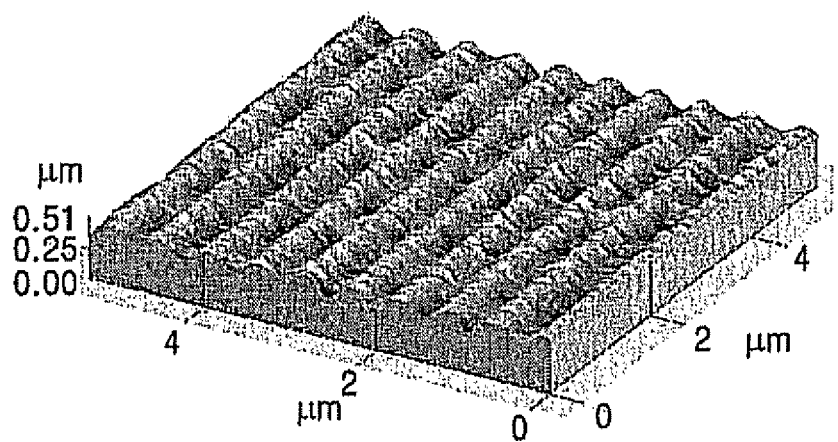
FIG. 4G-b
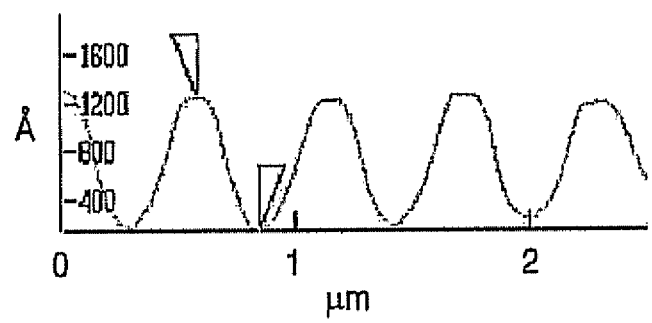

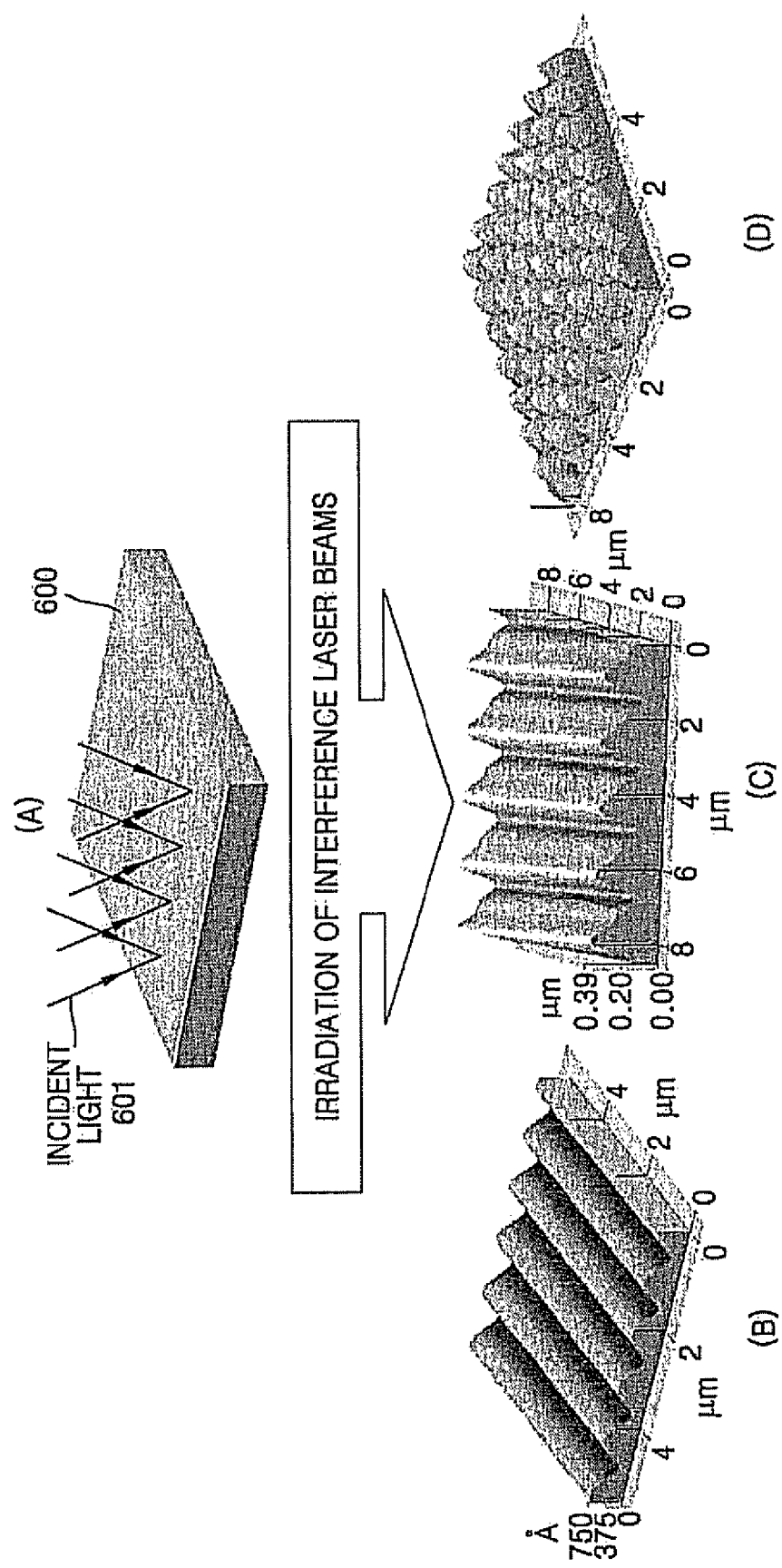

METHOD OF MANUFACTURING NITRIDE-BASED SEMICONDUCTOR LIGHT EMITTING DEVICE

This application claims priority to Korean Patent Application No. 10-2006-0045112, filed on May 19, 2006, and all the benefits accruing therefrom under 35 USC § 119(a), the content of which is incorporated herein by reference in its entirety.

BACKGROUND OF THE INVENTION

1. Field of the Invention

The present invention relates to a semiconductor light emitting device, and more particularly, to a method of manufacturing a nitride-based semiconductor light emitting device having an improved structure in which optical extraction efficiency is improved.

2. Description of the Related Art

Light emitting devices, such as light emitting diodes ("LEDs"), are generally semiconductor p-n junction diodes. Silicon p-n junctions continue to play a leading role in the electronic information revolution, and p-n junctions of a group III-V semiconductor continue to play a leading role in the optical revolution away from traditional incandescent or fluorescent light sources and toward LED-based lighting. Group III-V semiconductors are made by combining group III and group V elements, also referred to as group 13 and group 15 elements. They have an advantage of a luminous efficiency that is almost 100%. The luminous efficiency of these materials is approximately one thousand times higher than that of silicon. Thus, starting from the initial stage of development of a material, LEDs are widely used in light emitting devices such as diode lasers, and therefore play a leading role in the development of devices arising at the forefront of the optical revolution. In addition, since LEDs have a higher movement speed of electrons and can operate at a high temperature, they are widely used in high-speed and high-power electronic devices. In particular, several group III and group V elements are mixed with one another so that a semiconductor having a variety of material compositions and accompanying characteristics can be manufactured.

As basic characteristics of an LED, luminosity (units: candela ("cd")) is used to describe an LED that emits in the visible region of the electromagnetic spectrum, and radiant flux (units: watt) is used to describe an LED that emits in the invisible region of the electromagnetic spectrum. Luminosity is measured as light velocity per unit cubic angle, and brightness is measured as luminosity per unit area. A photometer is used to measure luminosity. Radiant flux represents all power radiated from all wavelengths of an LED and is measured in energy radiated per unit time.

Main factors for determining the performance of a visible ray LED are luminous efficiency, measured in lumens per watt (lm/W). This measure corresponds to a wall-plug efficiency (i.e., total electrical to optical output power efficiency) that takes into consideration the response of the human eye to the luminosity of a light source. Luminous efficiency of an LED can be mainly determined by three factors: internal quantum efficiency, extraction efficiency, and operating voltage. Research into improvement of luminous efficiency is currently underway.

In general, conventional LEDs have a sapphire/n-GaN/MQW/p-GaN structure, wherein "MQW" is the multi-quantum well. However, in such LEDs, defect density is high due to limitations of manufacture technology. Thus, limitations to be addressed in the current technical objectives include improving internal quantum efficiency of an MQW layer, and manufacturing a high-power LED. Accordingly, and desirably, the structure of an LED should be improved so that the limitations can be overcome and external extraction efficiency of light can be increased.

BRIEF SUMMARY OF THE INVENTION

In view of the foregoing deficiencies of the prior art, the present invention provides a method of manufacturing a nitride-based semiconductor light emitting device having an improved structure in which optical extraction efficiency is improved.

In an embodiment, there is provided a method of manufacturing a nitride-based semiconductor light-emitting device including an n-doped semiconductor layer, an active layer, a p-doped semiconductor layer, an n-electrode and a p-electrode, the method comprising: forming an azobenzene-functionalized polymer film on a surface of a base layer selected from one layer of the group consisting of the n-doped semiconductor layer, the p-doped semiconductor layer, the n-electrode and the p-electrode as the base layer; forming surface relief gratings with a micro-pattern by a photophysical mass transport property of azobenzene-functionalized polymer by irradiating the azobenzene-functionalized polymer film with interference laser beams; forming a photonic crystal layer using a metal oxide in a recessed gap of the micro-patterned azobenzene-functionalized polymer film; and removing the azobenzene-functionalized polymer film.

In another embodiment, a photophysical mass transport phenomenon of azobenzene-functionalized polymer is used such that a nitride-based semiconductor light-emitting device having a plurality of photonic crystal arrays is manufactured. Accordingly, optical output and optical extraction efficiency in the nitride-based semiconductor light-emitting device manufactured according to the present invention can be improved as compared to the prior art.

BRIEF DESCRIPTION OF THE DRAWINGS

The above and other aspects will become more apparent by describing in detail exemplary embodiments thereof with reference to the attached drawings in which:

FIGS. 4A through 4I illustrate an exemplary method of manufacturing a nitride-based semiconductor light emitting device according to an embodiment;

FIG. 6 is an atomic force microscopy ("AFM") photo showing exemplary surface unevenness (protrusions and recesses) in various shapes that can be formed on azobenzene-functionalized polymer by irradiating interference laser beams in FIG. 4D.

DETAILED DESCRIPTION OF THE INVENTION

Figure 1:
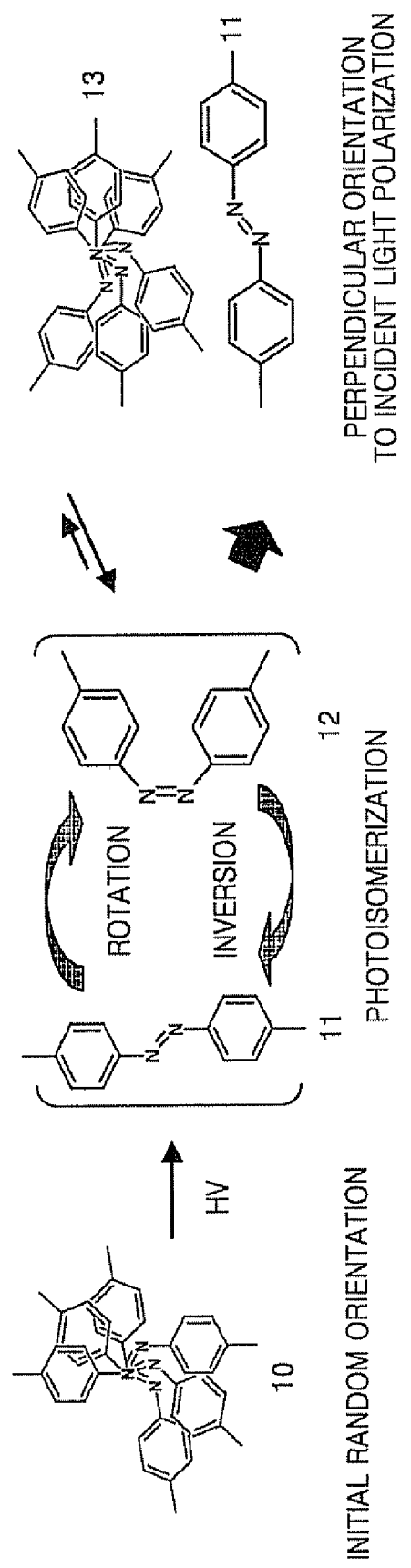
FIG. 1 is a schematic view of an exemplary photoisomerization of azobenzene-functionalized polymer.

The present invention will now be described more fully with reference to the accompanying drawings, in which exemplary embodiments of the invention are shown. In the drawings, the thicknesses of layers and regions are exaggerated for clarity.

It will be understood that when an element is referred to as being "on" another element, it can be directly on the other element or intervening elements may be present therebetween. In contrast, when an element is referred to as being "disposed on" another element, the elements are understood to be in at least partial contact with each other, unless otherwise specified.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Figure 2:
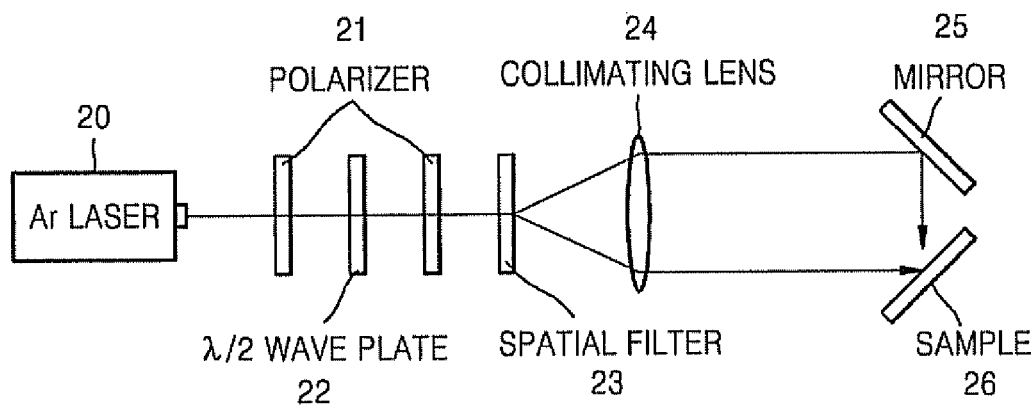
FIG. 2 is a schematic view of an exemplary optical apparatus for irradiating interference laser beams onto azobenzene-functionalized polymer.
Figure 3:
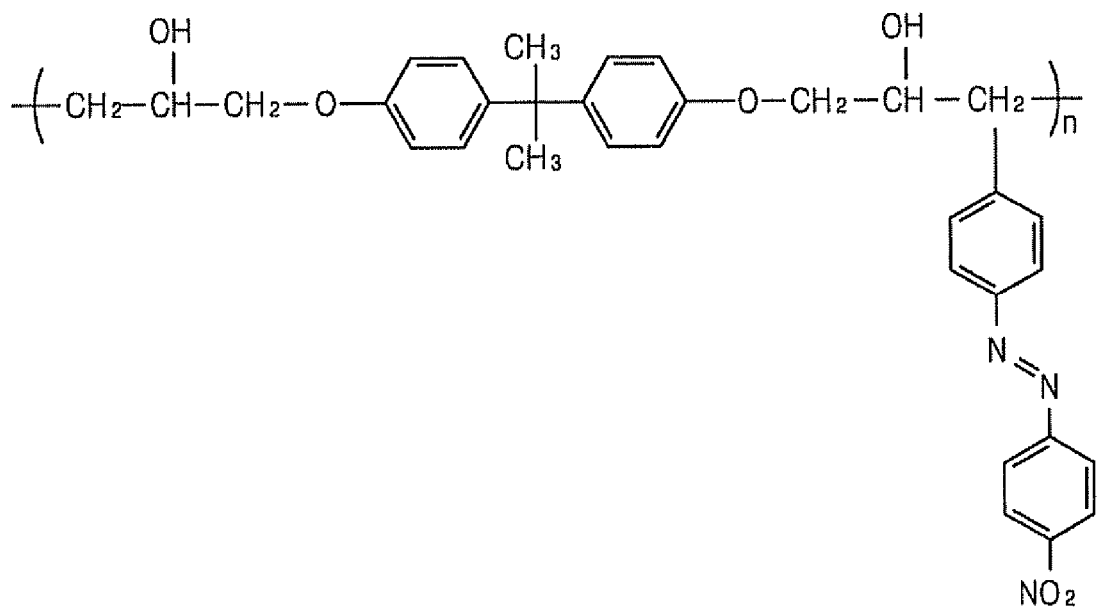
FIG. 3 is a structural formula of polydisperse orange 3 ("PDO3") used as azobenzene-functionalized polymer according to the present invention.

FIG. 1 is a schematic view of a photoisomerization reaction of an azobenzene-functionalized polymer, FIG. 2 is a schematic view of an optical apparatus for irradiating interference laser beams onto an azobenzene-functionalized polymer, and FIG. 3 is a formula of PDO3 used as an azobenzene-functionalized polymer according to an embodiment.

Properties of the azobenzene-functionalized polymer used herein will now be described with reference to FIG. 1. An azobenzene group has an isomerizable structure (interchangeably a bent "Z" isomer structure 12 to a linear "E" isomer structure 11) in which two phenyl groups are connected to each other by two doubly bonded nitrogen atoms. The azobenzene group is an aromatic compound in which electrons are delocalized over the entire molecule by lateral overlap of p-orbitals. The azobenzene-functionalized polymer is widely known to be polarizable to have perpendicular orientation to incident light polarization. As used herein, "perpendicular orientation to incident light polarization" refers to a property in which, when the azobenzene-functionalized polymer is exposed to linearly-polarized light, the azobenzene-functionalized groups are orientated perpendicular to the linear polarization direction of incident light. When interference laser beams are irradiated onto the surface of the azobenzene-functionalized polymer film by utilizing the perpendicular orientation to incident light polarization, a photophysical mass transport phenomenon in the azobenzene-functionalized polymer may be induced that is based on photoisomerization of the azobenzene-functionalized groups from the Z form to the E form. As a result of the accompanying volume change in the exposed regions of the azobenzene-functionalized polymer film, surface relief grating of micropatterns may be formed on the surface of the azobenzene-functionalized polymer film.

A polymeric material having a molecular weight in the range of thousands to hundreds of thousands of atomic mass units ("AMU") may be used as the azobenzene-functionalized polymer. As used herein and when referring to a polymer, "molecular weight" refers to weight averaged molecular weight ("Mw"), unless otherwise specified. In an embodiment, the polymeric material has a weight averaged molecular weight of 1,000 to 500,000. The larger the molecular weights of the material, the slower the photophysical action upon its exposure to linearly-polarized light. Thus, the kinetics of the photophysical action is controlled by the molecular weight of the material. For example, when organic glass comprising an azobenzene-functionalized polymer and having a small amount of chain entanglement is used, formation of surface relief gratings may be performed within a short time since the photophysical action upon exposure to linearly-polarized light occurs rapidly.

Referring to FIG. 2, an optical apparatus for irradiating interference laser beams generally uses an Ar laser 20 of 488 nm wavelength as a light source. A linearly-polarized light passes through a $\lambda/2$ wave plate 22 becoming p-polarized by passing through polarizer 21, then passes through a spatial filter 23 and a collimating lens 24 in sequence to reach a sample 26. A portion of the parallel light that passes the collimating lens 24 reaches the sample 26 directly, and the other portion of light is reflected on a mirror surface 25 and reaches the sample 26 separately. Here, an optical material for the $\lambda/2$ wave plate 22 may be a material having a property in which a p-polarization or linearly-polarized surface can be rotated within the range of an angle of 0-90°. When an optical material having such polarization property is used, surface relief gratings can be effectively formed. In an embodiment, a substrate having an azobenzene-functionalized polymer disposed thereon is rotated along an axis coincident with the irradiation direction of the interference laser beams and an exposure process is repeatedly performed during rotation, resulting in surface relief gratings having a variety of shapes such as a two dimensional (2-D) pattern or a three dimensional (3-D) pattern.

FIGS. 4A through 4I illustrate a method of manufacturing a nitride-based semiconductor light-emitting device according to an embodiment.

Figure 4A:
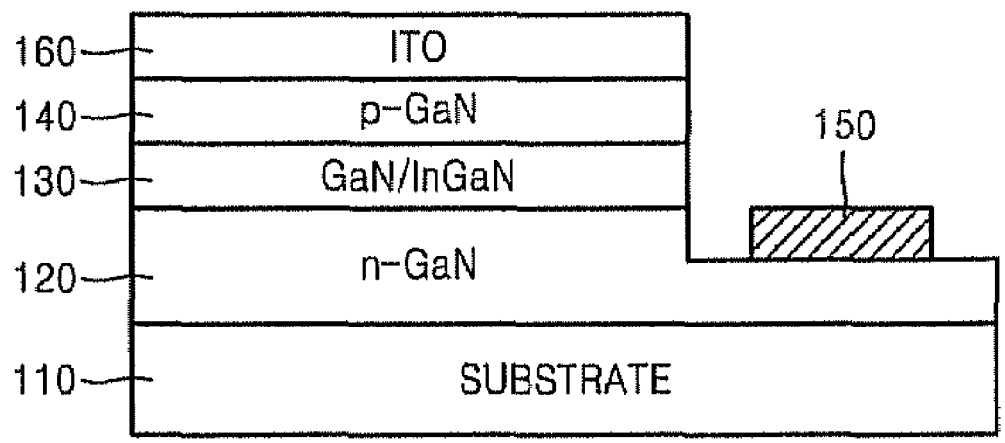
Figure 4B:
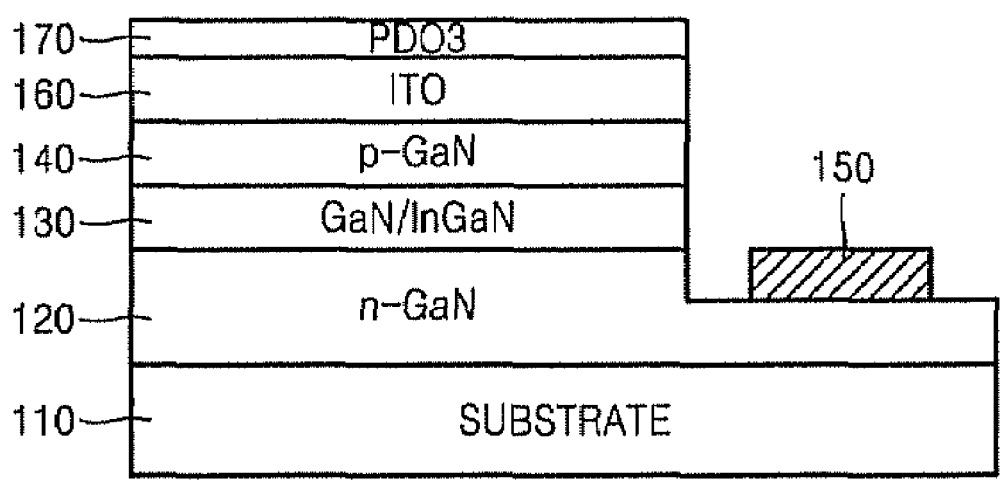

Referring to FIGS. 4A and 4B, in the method of manufacturing a nitride-based semiconductor light-emitting device including a substrate 110, an n-doped semiconductor layer 120, an active layer 130, a p-doped semiconductor layer 140, an n-electrode 150, and a p-electrode 160, one layer is selected from the group consisting of the n-doped semiconductor layer 120, the p-doped semiconductor layer 140, the n-electrode 150, and the p-electrode 160 as a base layer and an azobenzene-functionalized polymer film 170 is formed on the base layer. In the current embodiment, the p-electrode 160 is selected as the base layer.

Referring to FIG. 4A, first, the n-doped semiconductor layer 120 is formed on a surface of a previously-prepared substrate 110, for example, on a Si, GaAs, SiC, GaN or sapphire substrate by a typical deposition and stacking method (for example, growth of a GaN-based crystal layer on a GaN substrate) or a different kind of stacking method (for example, growth of a GaN-based crystal layer on a sapphire substrate). The n-doped semiconductor layer 120 is formed of an AlInGaN-based group III-V nitride semiconductor material, and in a specific embodiment can be formed of an n-GaN layer. Here, the n-doped semiconductor layer 120 may be formed by vapor deposition such as halide or hydride vapor phase epitaxy ("HVPE"), metal organic chemical vapor deposition ("MOCVD"), molecular beam epitaxy ("MBE"), plasma enhanced chemical vapor deposition ("PECVD"), sputtering, or evaporation. These methods are well known to one skilled in the art and thus a detailed description thereof will be omitted.

After that, the active layer 130 is disposed on a surface of the n-doped semiconductor layer 120, and the p-doped semiconductor layer 140 is disposed on a surface of the active layer 130 opposite the n-doped semiconductor layer 120. Here, similarly, the active layer 130 and the p-doped semiconductor layer 140 may each be formed by a variety of vapor deposition techniques such as HVPE, MOCVD, or MBE.

The active layer 130 is formed of a GaN-based group III-V nitride semiconductor layer comprising is $In_xAl_yGa_{1-x-y}N$ ($0 \leq x \leq 1$, $0 \leq y \leq 1$ and $0 \leq x+y \leq 1$), and in a specific embodiment, may be formed of an InGaN layer or AlGaN layer. Here, the active layer 130 may be of any structure of a multi-quantum well or a single quantum well. The structure of the active layer 130 does not limit the technical scope of the present invention. For example, in an embodiment, the active layer 130 may be formed of a GaN/InGaN/GaN MQW or GaN/AlGaN/GaN MQW structure. In addition, the p-doped semiconductor layer 140 is formed of a p-GaN-based group III-V nitride semiconductor layer and in particular, may be formed of a p-GaN layer or p-GaN/AlGaN layer.

Then, a predetermined region of a surface of the p-doped semiconductor layer 140 is etched to a predetermined depth of the n-doped semiconductor layer 120 and an etched surface is formed on the n-doped semiconductor layer 120. Next, the n-electrode 150 and the p-electrode 160 are formed of a conductive material on the etched surfaces of each of the n-doped semiconductor layer 120 and the p-doped semiconductor layer 140. Preferably, the n-electrode 150 or the p-electrode 160 may be formed of a transparent conductive oxide. The transparent conductive oxide may be one oxide selected from the group consisting of indium tin oxide ("ITO"), zinc-doped indium tin oxide ("ZITO"), zinc indium oxide ("ZIO"), gallium indium oxide ("GIO"), zinc tin oxide ("ZTO"), fluorine-doped tin oxide ("FTO"), aluminum-doped zinc oxide ("AZO"), gallium-doped zinc oxide ("GZO"), $In_4Sn_3O_{12}$, and zinc magnesium oxide ($Zn_{1-x}Mg_xO$, $0 \leq x \leq 1$). Specific examples of the transparent conductive oxides include $Zn_2In_2O_5$, $GaInO_3$, $ZnSnO_3$, F-doped $SnO_2$, Al-doped ZnO, Ga-doped ZnO, MgO, or ZnO. In the current embodiment, the p-electrode 160 is formed of ITO.

Referring to FIG. 4B, the p-electrode 160 and formed of ITO is selected as a base layer, azobenzene-functionalized polymer, for example, poly disperse orange 3 (PDO3) is coated on a surface of the p-electrode 160 (also referred to for the purpose of the exemplary embodiment described in FIGS. 4A-4I as "ITO layer 160") opposite the p-doped semiconductor layer 140 to form an azobenzene-functionalized polymer film 170 is formed. To coat the azobenzene-functionalized polymer, a spin coating method can be employed but other coating methods may also be used. Preferably, a material having a molecular weight in the range of thousands to hundreds of thousands AMUs may be selected and used as the azobenzene-functionalized polymer.

Figure 4C:
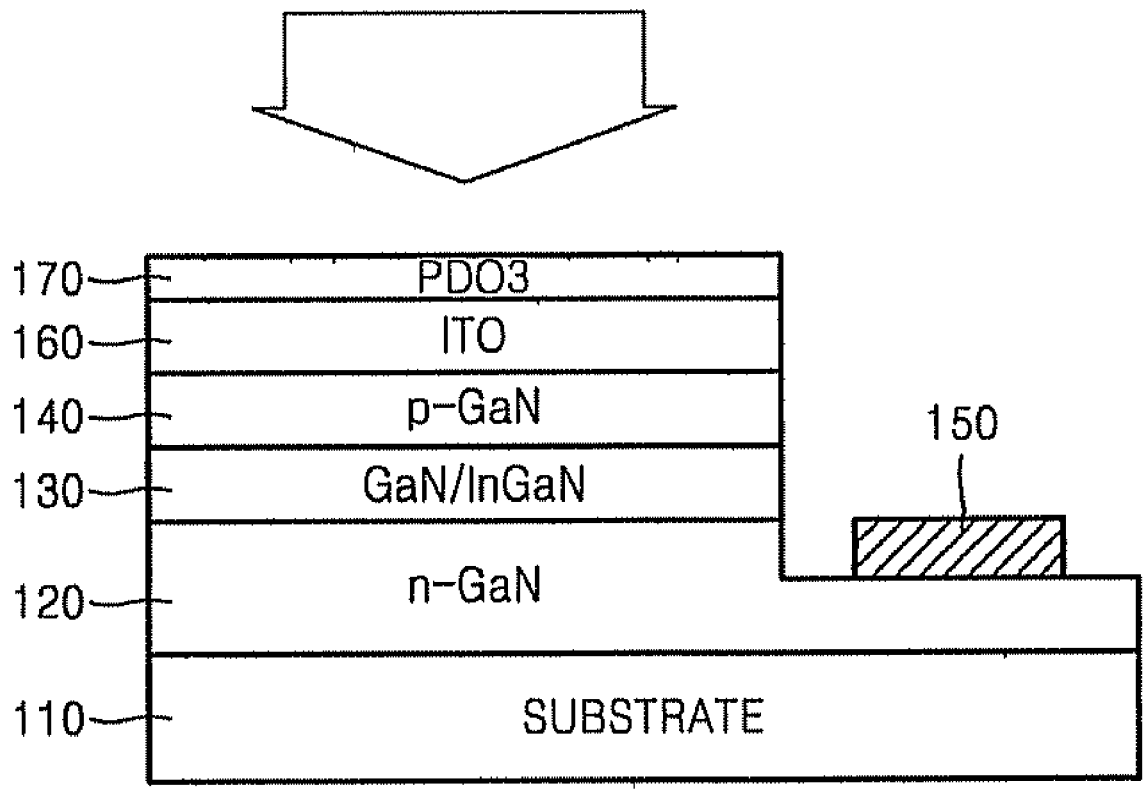

Referring to FIGS. 4C and 4D, interference laser beams are irradiated onto the azobenzene-functionalized polymer film 170 using the optical apparatus illustrated in FIG. 2, thereby forming a micro-pattern of surface relief gratings caused by photophysical mass transport of the azobenzene-functionalized polymer. Referring to FIG. 4D, such surface relief gratings include a protrusion 170a and an recessed gap 170b, and for easy understanding of the unevenness (protrusions and recesses) of the structure, an AFM micrograph showing surface relief gratings in perspective (FIG. 4D-a) and cross-sectional views (4D-b) are also shown. The line width of the micro-pattern, specifically, the line width of the recessed gap 170b is formed in a pattern having a size of several tens of nanometers to several thousands of nanometers. In an embodiment, the pattern has a pattern dimension of less than or equal to 2 μm, specifically less than or equal to 1 μm. In addition, the repeating cycle (i.e., peak-to-peak or trough-to-trough distance) of the micro-pattern may be les than or equal to 10 μm. Here, when the substrate 110 wherein the azobenzene-functionalized polymer film 170 is formed is rotated along an axis coincident with the irradiation direction of the interference laser beams and an exposure process is repeatedly performed, surface relief gratings having a variety of shapes such as a two dimensional (2-D) pattern or a three dimensional (3-D) pattern can be obtained.

Figure 4E:
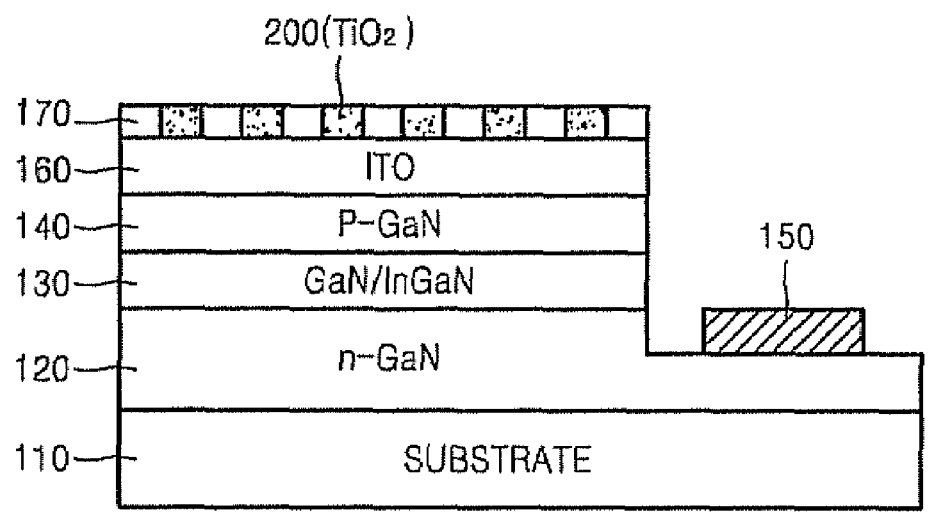

Referring to FIG. 4E, a photonic crystal layer 200 formed of a metal oxide is formed in the recessed gap 170b of the azobenzene-functionalized polymer film 170. The photonic crystal layer 200 includes a plurality of photonic crystal arrays. Since the line width of the recessed gap 170b can be formed in a micro-pattern having a size of several tens through thousands of nanometers, the photonic crystal layer 200 formed on the recessed gap 170b may also have a micro-pattern corresponding to the line width of the recessed gap 170b. Here, the metal oxide may be an oxide of a metal selected from the group consisting of titanium, zinc, niobium, tin, nickel, and tungsten. The photonic crystal layer 200 may be formed by a sol-gel process. In this case, a precursor of the previously-described metal oxide may be used. The precursor of the metal oxide may be manufactured to include at least one functional group selected from the group consisting of alkoxide, nitrate, chloride, acetate, and a combination comprising at least one of the foregoing functional groups. In the current embodiment, the photonic crystal layer 200 is formed of $TiO_2$.

Figure 4F:
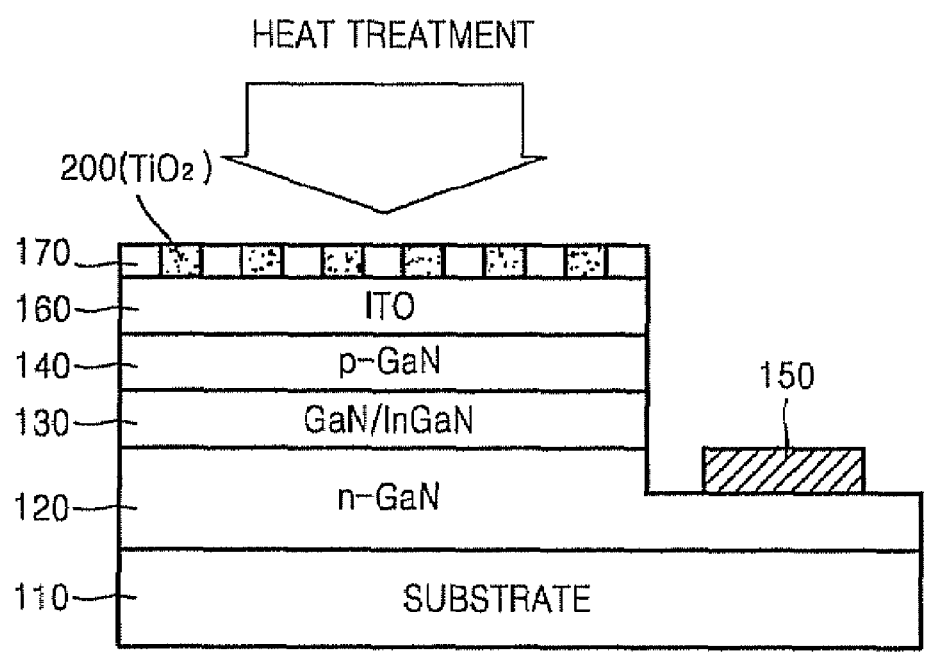

Referring to FIGS. 4F and 4G, heat treatment is performed at a temperature of room temperature to 425° C., thereby decomposing or removing the azobenzene-functionalized polymer film 170. Such heat treatment may be performed for 1-12 hours and in an embodiment, may be performed by a multi-step process. Specifically, the heat treatment process may include a first operation of increasing the temperature from room temperature to 100° C. for 30 minutes and maintaining the temperature at 100° C. for 1 hour, a second operation of increasing the temperature from 100° C. to 350° C. for 30 minutes and maintaining the temperature at 350° C. for 5 hours, and a third operation of increasing temperature from 350° C. to 425° C. for 30 minutes and maintaining the temperature at 425° C. for 2 hours. Through the multi-step heat treatment process, the occurrence of defects that may occur in the photonic crystal layer 200 in the heat treatment process can be minimized, e.g., thermal damage to other material layers, that is, to the n-doped semiconductor layer 120, the active layer 130, the p-doped semiconductor layer 140, the n-electrode 150, and the p-electrode 160 can be minimized.

By the above process, the nitride-based semiconductor light-emitting device having a structure of photonic crystal arrays in which optical output and optical extraction efficiency are improved can be manufactured. For assistance in understanding the present invention, as a result of removing the azobenzene-functionalized polymer film 170, an AFM micrograph showing a pattern of the photonic crystal layer 200 formed on the ITO layer 160 is shown in perspective view (FIG. 4G-a) and in cross-section (FIG. 4G-b). The photonic crystal arrays are formed in a micro-pattern having a size of less than or equal to 1 µm so that light generated within the active layer 130 is diffracted and/or diffused, and the external extraction efficiency of light can be more effectively increased; in particular, internal total reflection of generated light can be minimized. Accordingly, optical output and optical extraction efficiency in the nitride-based semiconductor light-emitting device manufactured by the method illustrated in FIGS. 4A through 4I can be improved when compared to the prior art.

Figure 4H:
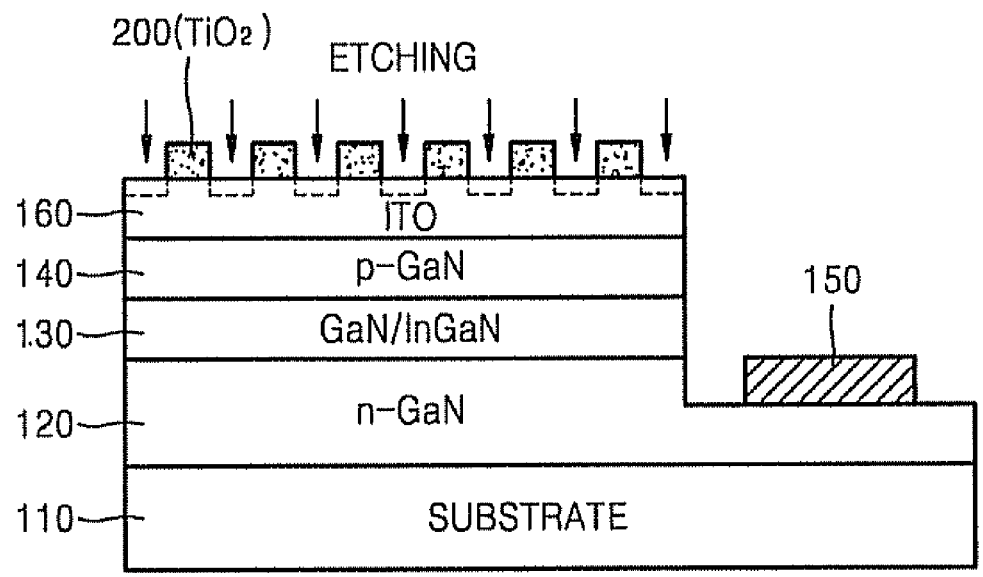
Figure 4I:
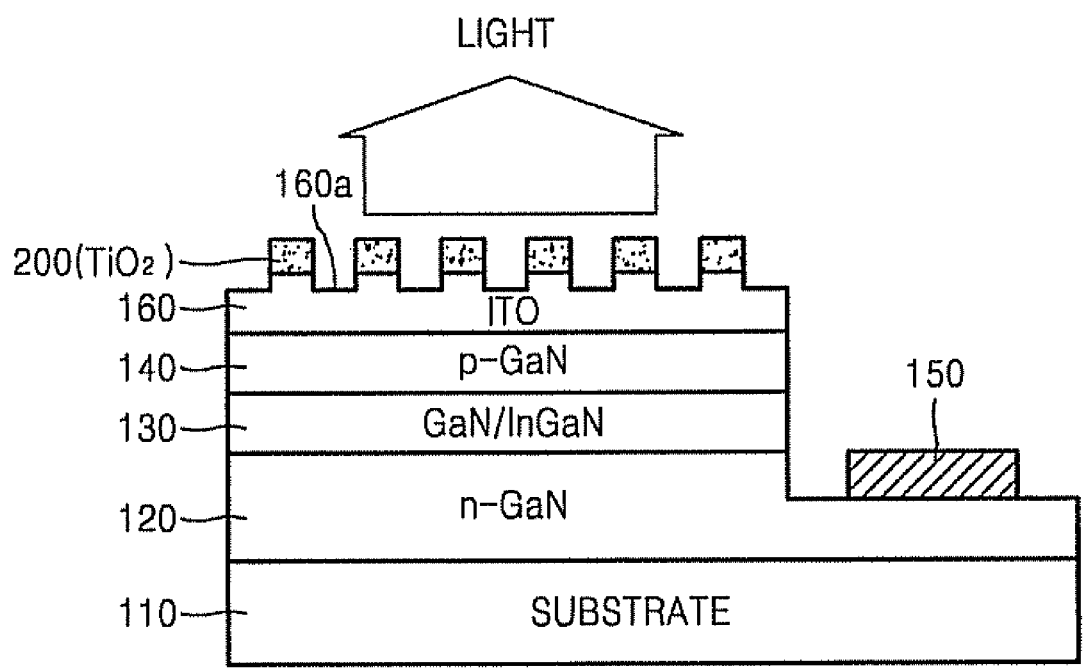

Referring to FIGS. 4H and 4I, in an embodiment, the ITO layer 160 can be further etched to a predetermined depth using the photonic crystal layer 200 as an etch mask. A process such as dry etching or wet etching may be used as the etching process. Specifically, dry etching by inductively coupled plasma ("ICP") etching or reactive ion etching ("RIE") can be used. In the dry etching process, at least one gas selected from the group consisting of a halogen gas, a methane gas, a hydrogen gas, tetrafluoromethane gas, and a combination comprising at least one of the foregoing gases, may be selected as a reaction gas. Conditions for mixing the gases may be adjusted appropriately if necessary, the determination of which are within the capability of one skilled in the art.

By the above process, a micro-pattern having a size of less than or equal to 1 µm can be formed on the ITO layer 160. A pattern of the ITO layer 160 may comprise photonic crystal arrays together with the photonic crystal layer 200. Preferably, a pattern depth of the ITO layer 160 may be several nanometers to several hundreds of nanometers. In the current embodiment, due to the fine pattern formed on the ITO layer 160, light generated within the active layer 130 is diffracted and/or diffused so that external extraction efficiency of light can be effectively increased and internal total reflection of generated light can be minimized. However, a process of forming micro-patterns on the ITO layer 160 is not an essential process in the present invention and is thus an optional process that can be additionally performed if necessary.

Figure 5:
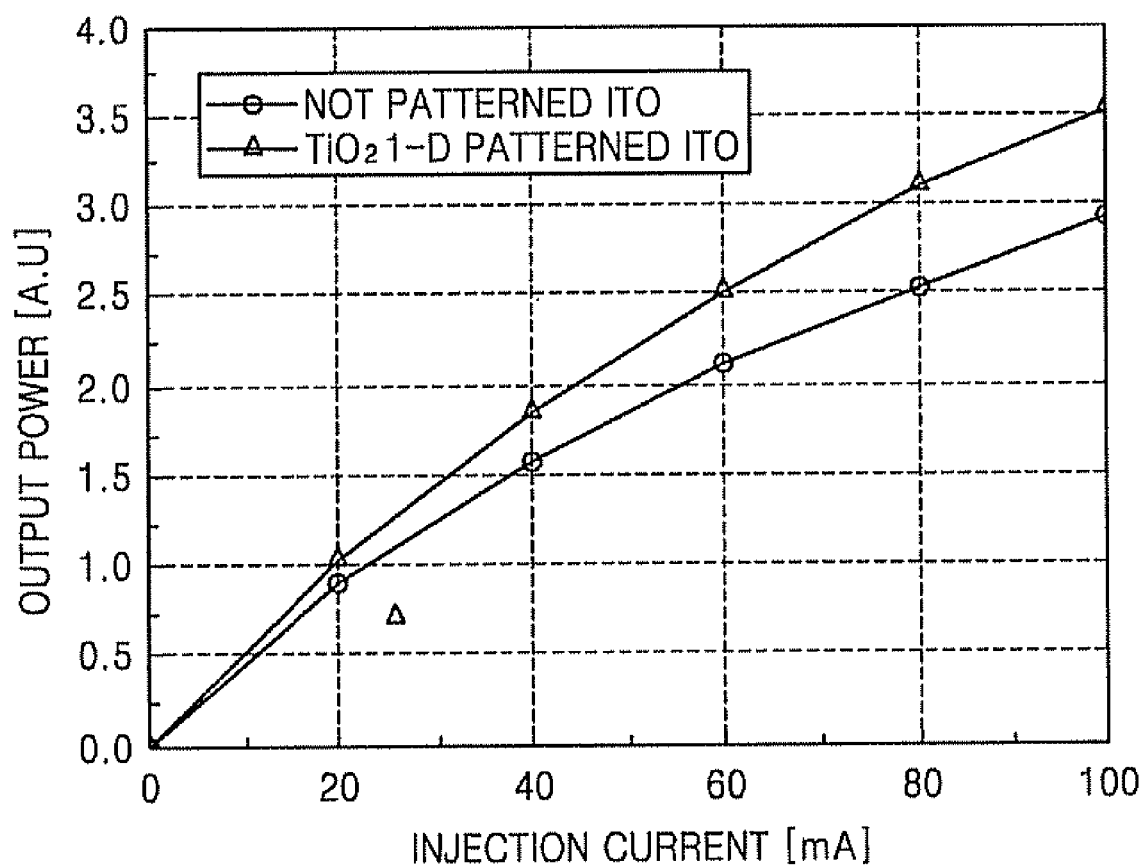
FIG. 5 is a graph of an optical output versus an injection current in an exemplary nitride-based semiconductor light emitting device manufactured by the method illustrated in FIGS. 4A through 4I.

FIG. 5 is a graph of an optical output versus an injection current in a nitride-based semiconductor light emitting device manufactured by the method illustrated in FIGS. 4A through 4I.

FIG. 6 are AFM micrographs showing patterned surface unevenness (i.e., protrusions and gaps) in various shapes (FIG. 6, (B)-(D)) that can be formed on an azobenzene-functionalized polymer film 600 by irradiating the surface with interference laser beams 601 in FIG. 6 (A).

Figure 7A:
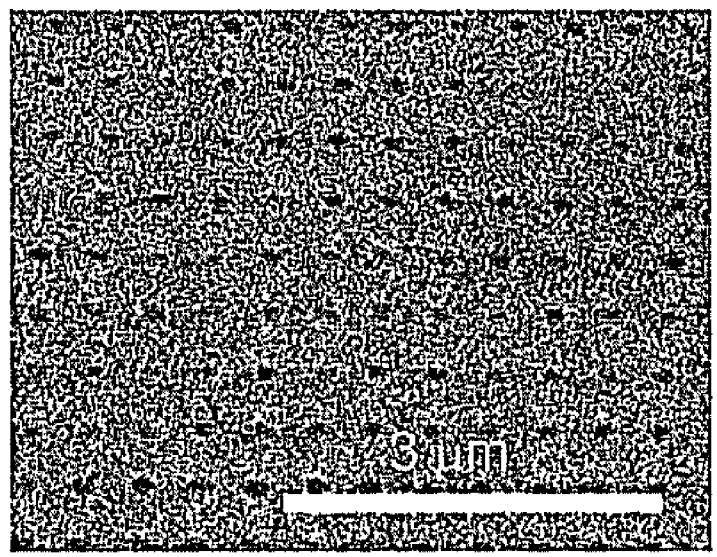
FIGS. 7A and 7B are respectively AFM photos showing exemplary optical crystal layer patterns in various shapes that can be formed in FIG. 4G.
Figure 7B:
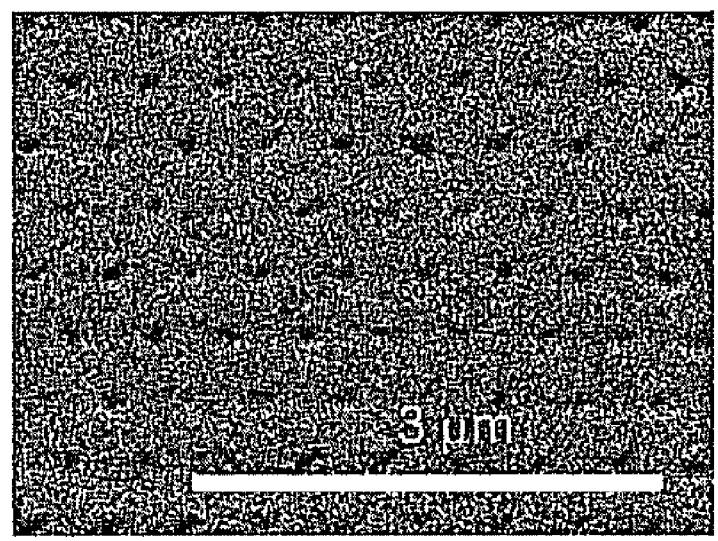

FIGS. 7A and 7B are respectively AFM micrographs showing optical crystal layer patterns in various shapes that can be formed in FIG. 4G.

Example—Forming of photonic crystal layer and patterning of an ito layer using the photonic crystal layer.

PDO3 (see structure, FIG. 3) was used as the azobenzene-functionalized polymer. A solution of PDO3 was prepared by dissolving the PDO3 in cyclohexanone and the solution was spin-coated on a previously-prepared ITO layer. The PDO3 was coated to a thickness 500 nm. The PDO3 was dried in a vacuum oven of 100° C., so as to remove any organic solvents from the coated solution and as a result, a PDO3 film was formed. The PDO3 film was exposed to coherent light from an argon laser operating at a wavelength 488 nm using the optical apparatus illustrated in FIG. 2 for 1 hour, and surface relief gratings including a protrusion and a recessed gap were formed in the PDO3 film.

Next, a metal oxide precursor solution was prepared by mixing titanium isopropoxide, isopropanol, and hydrochloric acid in a volume ratio of 1:40:4, the metal oxide precursor solution was spin-coated to fill the recessed gaps of the exposed PDO3 film, and a photonic crystal layer was formed. The photonic crystal layer so manufactured includes a plurality of photonic crystal arrays. Next, heat treatment was performed by processing from room temperature to 425° C., and the azobenzene-functionalized polymer film was removed. Specifically, the heat treatment process was performed by a first operation of increasing temperature from room temperature to 100° C. for 30 minutes and maintaining the temperature at 100° C. for 1 hour, a second operation of increasing temperature from 100° C. to 350° C. for 30 minutes and maintaining the temperature at 350° C. for 5 hours, and a third operation of increasing temperature from 350° C. to 425° C. for 30 minutes and maintaining the temperature at 425° C. for 2 hours. Next, the ITO layer was etched to a predetermined depth, specifically, to a depth of 150 nm, using the photonic crystal layer as an etch mask. To etch the ITO layer, inductively coupled plasma (ICP) was used at a power of 1,000 watts for 2 minutes with a mix of argon (Ar) gas and methane ($CH_4$) gas as reaction gases in a volume ratio of 9:1.

According to the present invention, a photophysical mass transport phenomenon of azobenzene-functionalized polymer is used such that a nitride-based semiconductor light-emitting device having a plurality of photonic crystal arrays is manufactured. The photonic crystal arrays are formed in a micro-pattern having a size of less than or equal to 1 µm such that light generated within an active layer is diffracted or/and diffused and external extraction efficiency of light is more effectively increased and in particular, internal total reflection of generated light is minimized. Accordingly, optical output and optical extraction efficiency in the nitride-based semiconductor light-emitting device manufactured according to the present invention can be improved compared to the prior art.

While the present invention has been particularly shown and described with reference to exemplary embodiments thereof, it will be understood by those skilled in the art that various changes in form and details may be made therein without departing from the spirit and scope of the invention as defined by the following claims.

What is claimed is:

1. A method of manufacturing a nitride-based semiconductor light-emitting device including an n-doped semiconductor layer, an active layer, a p-doped semiconductor layer, an n-electrode and a p-electrode, the method comprising:
   forming an azobenzene-functionalized polymer film on a base layer by selecting one layer from the group consisting of the n-doped semiconductor layer, the p-doped semiconductor layer, the n-electrode and the p-electrode as the base layer;
   forming surface relief gratings of a micro-pattern caused by a photophysical mass transport property of azobenzene-functionalized polymer by irradiating interference laser beams onto the azobenzene-functionalized polymer film;
   forming a photonic crystal layer using a metal oxide on an recessed gap of the azobenzene-functionalized polymer film; and
   removing the azobenzene-functionalized polymer film.

2. The method of claim 1, further comprising etching the base layer using the photonic crystal layer as an etch mask.

3. The method of claim 1, wherein the metal oxide comprises an oxide of a metal, the metal selected from the group consisting of titanium, zinc, niobium, tin, nickel, tungsten, and a combination comprising at least one of the foregoing metals.

4. The method of claim 3, wherein the photonic crystal layer is formed by a sol-gel process using a metal oxide precursor.

5. The method of claim 4, wherein the metal oxide precursor comprises one functional group selected from the group consisting of alkoxide, nitrate, chloride, acetate, and a combination comprising at least one of the foregoing functional groups.

6. The method of claim 1, wherein the removing of the azobenzene-functionalized polymer film is performed by a heat treatment process carried out from room temperature to 425° C.

7. The method of claim 6, wherein the heat treatment is performed for 1 to 12 hours.

8. The method of claim 1, wherein the azobenzene-functionalized polymer has a weight averaged molecular weight of 1,000 to 500,000.

9. The method of claim 1, wherein the azobenzene-functionalized polymer comprises polydisperse orange 3 (PDO3).

10. The method of claim 1, wherein a 488 nm Ar laser is used as the source of the interference laser beams.

11. The method of claim 1, wherein the micro-pattern is formed in a pattern having a pattern dimension of 2 μm or less.

12. The method of claim 11, wherein a period of the micro-pattern is less than or equal to 10 μm.

13. The method of claim 12, wherein the micro-pattern is formed in a pattern having a pattern dimension of equal to or less than 1 μm.

14. The method of claim 1, wherein the micro-pattern is formed in a one dimensional (1-D) pattern, a two dimensional (2-D) pattern or a three dimensional (3-D) pattern.

15. The method of claim 1, wherein the n-electrode is formed of a transparent conductive oxide.

16. The method of claim 1, wherein the p-electrode is formed of a transparent conductive oxide.

17. A nitride-based semiconductor light-emitting device manufactured by the method of claim 1.

* * * * *